United States Patent [19]

Sawada

[11] Patent Number: 4,976,792
[45] Date of Patent: Dec. 11, 1990

[54] ELECTRIC CONDUCTOR AND METHOD OF MANUFACTURING SAME

[75] Inventor: Kazuo Sawada, Osaka, Japan

[73] Assignee: Sumitomo Electric Industries, Ltd., Osaka, Japan

[21] Appl. No.: 427,956

[22] Filed: Oct. 25, 1989

Related U.S. Application Data

[63] Continuation of Ser. No. 295,004, Jan. 9, 1989, abandoned, which is a continuation of Ser. No. 170,092, Mar. 9, 1988, abandoned, which is a continuation of Ser. No. 818,751, Jan. 14, 1986, abandoned.

[30] Foreign Application Priority Data

Jan. 14, 1985 [JP] Japan ................................. 60-4336
Jan. 14, 1985 [JP] Japan ................................. 60-4337

[51] Int. Cl.$^5$ ................................................ C22C 9/00
[52] U.S. Cl. ................................... 148/404; 148/432; 420/469
[58] Field of Search ..................... 148/404, 432, 439; 420/469, 500, 497

[56] References Cited

U.S. PATENT DOCUMENTS

| | | | |
|---|---|---|---|
| 2,048,733 | 7/1936 | Eldred | 148/404 |
| 2,493,951 | 1/1950 | Druyvesteyn et al. | 148/404 |
| 4,582,545 | 4/1986 | Kamada et al. | 148/432 |

Primary Examiner—S. Kastler
Attorney, Agent, or Firm—Cushman, Darby & Cushman

[57] ABSTRACT

An electric conductor for video and audio appliances and a method of manufacturing the electric conductor. The electric conductor is constituted by a linear member made of copper or silver, which is composed of an assembly of segments each regarded substantially as single crystal having a length not less than twice a diameter of the single crystal. The method includes the steps of curing molten copper or molten silver into an ingot in a single direction along a longitudinal direction of the ingot and subjecting the ingot to cold working or warm working.

6 Claims, 2 Drawing Sheets

ELECTRIC CONDUCTOR AND METHOD OF MANUFACTURING SAME

This is a continuation of application No. 07/295,004, filed Jan. 9, 1989 which is an FWC of SN: 170,092, filed Mar. 9, 1988, which is an FWC of SN: 06/818,751, filed Jan. 14, 1986, which was abandoned upon the filing hereof.

BACKGROUND OF THE INVENTION

The present invention generally relates to electric conductors and more particularly, to an electric conductor used for wiring of high-frequency signal transmission circuits in video appliances such as a television (TV) set, a cathode ray tube (CRT), etc. or audio appliances and a method of manufacturing the electric conductor.

In these electronic appliances, when signals are not transmitted accurately without phase difference, ambiguous images and obscure sounds are produced in the video appliances and the audio appliances, respectively.

Conventionally, an annealed copper wire, into which tough pitch copper (pure copper containing 200 to 500 ppm of oxygen) or oxygen-free copper (pure copper containing substantially no oxygen) is subjected to cold working and then, is annealed for its softening so as to be recrystallized, or, in some cases, a hard drawn copper wire subjected to only cold working, or a copper wire obtained by plating one of the annealed copper wire and the hard drawn copper wire with tin, etc. has been used as the above described electric conductor.

However, the known copper wires have not necessarily been advantageous for accurate transmission of signals on the following grounds. Namely, the annealed copper wire has excellent flexibility and therefore, is used frequently. However, since crystal grains of the annealed copper wire are usually distributed in a configuration similar to that of a regular system due to the recrystallization upon the annealing, the number of grain boundaries traversed by electric current flowing in the longitudinal direction of the wire increases. Therefore, it is considered that defective transmission of signals, e.g., phase difference of the signals, especially, high-frequency component signals is greatly caused by the grain boundaries.

Meanwhile, the hard drawn copper wire has a crystal structure extending in the longitudinal direction of the wire in a fibrous manner as compared with the annealed copper wire. Since the number of grain boundaries traversed by electric current flowing in the longitudinal direction of the wire apparently becomes smaller than that of the annealed copper wire, the hard drawn copper wire is less likely to be adversely affected by the grain boundaries than the annealed copper wire. However, density of electron hole (point defect) and density of dislocation (line defect) in the hard drawn copper wire are far larger than those of the annealed copper wire and non-uniform electron density unsuitable for electric conduction is formed in many portions of the hard drawn copper wire, thereby resulting in possible phase difference of the high-frequency component signals.

SUMMARY OF THE INVENTION

Accordingly, an essential object of the present invention is to provide an electric conductor for video and audio appliances, having a microstructure in which grain boundaries of a linear member are small in number, portions having excessively non-uniform crystalline orientation are small in amount and foreign matter, impurities and gaseous matter in the crystal are small in amount such that noises and phase difference of signals at the time of flow of signal current are prevented from being generated, with substantial elimination of the disadvantages inherent in conventional electric conductors of this kind.

Another important object of the present invention is to provide a method of manufacturing an electric conductor of the above described type having a crystal structure in which crystal grains are arranged in parallel with each other in a longitudinal direction of the electric conductor and crystalline anisotropy is limited.

In order to accomplish these objects of the present invention, there is provided, in one aspect of the present invention, an electric conductor for video and audio appliances, which is, constituted by a linear member made of copper or silver; said linear member being composed of an assembly of segments each regarded substantially as single crystal having a length not less than twice a diameter of the single crystal.

Furthermore, there is provided, in another aspect of the present invention, a method of manufacturing an electric conductor for video and audio appliances, comprising the steps of: curing molten copper or molten silver into an ingot in a single direction along a longitudinal direction of said ingot; and subjecting said ingot to cold working or warm working into said electric conductor.

The electric conductor of the present invention is, for example, used for wiring of video appliances such as a TV set, a CRT, an office automation apparatus, etc. or audio appliances but is not restricted, in application, to signal transmission circuits therefor. The electric conductor of the present invention is used as a solid wire or a solid wire plated with tin, solder, etc. or a stranded wire composed of a plurality of the solid wires. The electric conductor of the present invention may have any arbitrary cross-sectional shape such as a circle, an ellipse, a quadrilateral, etc.

In the electric conductor of the present invention, it is preferable that copper or silver has a purity of 99.99% or more. If copper or silver has a purity of less than 99.99%, disordering of periodicity of an electronic structure of the crystal is likely to be caused by atoms of impurities present in the crystal, thereby resulting in possible production of noises and phase difference of high-frequency signals. Meanwhile, copper or silver having a purity of 99.99% or more has a high electric conductivity and therefore, is suitable for transmission of high-frequency signals.

The electric conductor of the present invention is constituted by the linear member which is composed of an assembly of segments each regarded substantially as single crystal having a length not less than twice a diameter of the single crystal. If the length of the single crystal is less than twice the diameter of the single crystal, the number of the grain boundaries traversed by electric current flowing in the longitudinal direction of the electric conductor increases. Since each segment is regarded substantially as single crystal in the electric conductor of the present invention, the number of the grain boundaries traversed by electric current flowing in the longitudinal direction of the electric conductor is reduced. Furthermore, since portions having non-uniform crystalline orientation are small in amount in the electric conductor of the present invention, noises and phase difference of signal current are not produced. Such microstructure can be obtained by growing the single-crystal linear member from the molten metal or further subjecting the single-crystal linear member to a working.

BRIEF DESCRIPTION OF THE DRAWINGS

These objects and features of the present invention will become apparent from the following description taken in conjunction with the preferred embodiments thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 1:
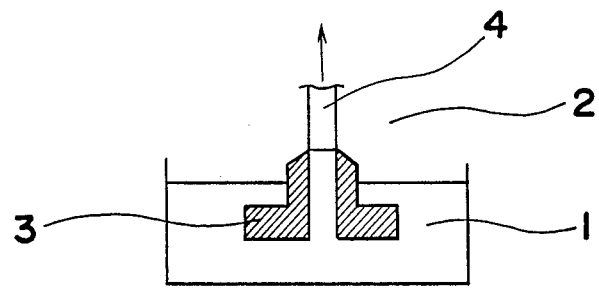
FIGS. 1 and 2 are schematic cross-sectional views explanatory of methods of manufacturing an electric conductor of the present invention, respectively.
Figure 2:
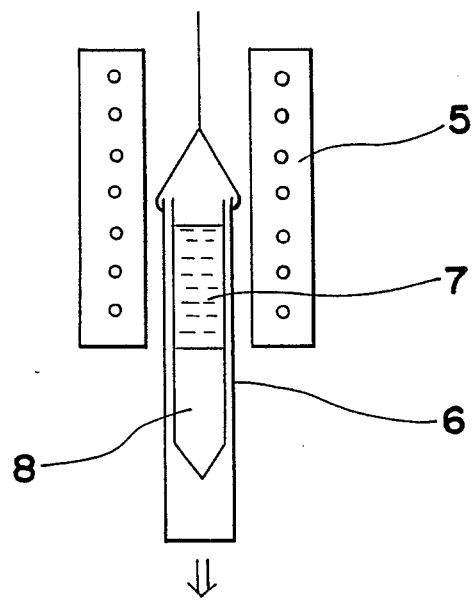

In order to manufacture an electric conductor according to the present invention, various methods of manufacturing single crystal can be employed as shown in FIGS. 1 and 2. It should be noted that methods of manufacturing the electric conductor of the present invention are not restricted to those shown in FIG. 1 and 2. The method of FIG. 1 is called an edge defined film growth (EFG) method. In FIG. 1, molten metal 1 is placed under inert atmosphere 2 such that a single-crystal fiber 4 is pulled upwardly from a capillary 3 provided at a liquid level of the molten metal 1.

Meanwhile, the method of FIG. 2 is called a vertical Bridgman method. In FIG. 2, raw material is loaded into a vessel 6 which is placed under vacuum or inert atmosphere in a tubular heating furnace 5. After the raw material has been sequentially molten from its lower portion into molten metal 7 while the vessel 6 is being displaced downwardly, the molten metal 7 is cured into single crystal 8.

In addition to an effect of manufacture of single crystal, these methods of FIGS. 1 and 2 of manufacturing single crystal achieve an effect that foreign matter, impurities and gaseous matter in the single crystal are small in amount due to not only a fact that the grain boundaries are small in number but processes of the methods of FIGS. 1 and 2.

If the single crystal thus obtained has a final diameter, the single crystal is directly used as a strand of the electric conductor and is plated or stranded as necessary. Meanwhile, if the single crystal has a diameter larger than a final diameter, the single crystal is further subjected to warm working or cold working, for example, rolling, wire drawing, etc. as necessary so as to be drawn into the final diameter. It can also be so arranged as required that the single crystal is subjected, during or after the working, to a heating process for lowering the dislocation density. When the dislocation density has been lowered, phase difference of signals, especially, high-frequency component signals is prevented from being produced.

(EXAMPLE 1)

In Example 1, the EFG method of FIG. 1 was employed. A single-crystal linear member, which is made of copper having a purity of 99.99% and has a diameter of 2 mm, is pulled upwardly from the capillary 3. After the single-crystal linear member has been subjected to cold working into a wire of 0.1 mm in diameter, the wire is heated at 120°C. for 2 hr. such that the dislocation density is lowered. Then, 19 wires thus obtained are stranded into an electric conductor. Subsequently, the electric conductor is subjected to insulating coating into an insulated electric wire.

In comparison with the insulated electric wire of the present invention, two insulated electric wires are likewise produced by using a prior art tough pitch copper wire (Comparative example 1) and a prior art oxygen-free copper wire (Comparative example 2).

Each of the three insulated electric wires of Example 1 and Comparative examples 1 and 2 is used for wiring in a combination appliance of a video tape recorder (VTR) and a TV set. Results of comparison of image quality and sound quality among the combination appliances are shown in Table 1 below.

TABLE 1

|  | Image Quality | Sound Quality |
| --- | --- | --- |
| Present Invention | Vivid and bright tone | Sharp and clear timbre without dullness |
| Comparative example 1 | Bad brightness | Dull timbre |
| Comparative example 2 | Bad brightness so excellent. | Timbre is rather sharp but is not |

From Table 1 above, it can be seen that the combination appliance having the electric wire of the present invention is clearer, in pictures and sounds, than those of Comparative examples 1 and 2.

(EXAMPLE 2)

In Example 2, the single-crystal linear member of 2 mm in diameter obtained in Example 1 is subjected to insulating coating into an electric wire. When the electric wire is used as a power source cord of the combination appliance of the VTR and the TV set of Example 1 and is used for wiring between the VTR and the TV set, it was found that image quality and sound quality of the combination appliance are further improved.

(EXAMPLE 3)

Single crystal of silver having a purity of 99.995% is produced by employing the Bridgman method of FIG. 2. Then, the single crystal is subjected to warm working, cold working and a light heating process having a temperature range free from recrystallization in a stage intermediate between the warm working and the cold working and thus, a fine wire of 0.05 to 0.2 mm in diameter is obtained. The fine wire is coated with enamel into an enameled winding. The enameled winding is used as a winding of a voice coil of a loudspeaker and of a coil of a microphone in an audio appliance.

In comparison with the enameled winding of the present invention, two comparative enameled windings are likewise produced by using a known copper wire made of tough pitch copper and a known copper wire made of oxygen-free copper and are each used as the windings of the audio appliance.

As a result of comparison of sound quality among the three audio appliances having the enameled winding of the present invention and the comparative enameled windings, respectively, it was found that sound quality of the audio appliance having the enameled winding of the present invention is far superior, in fidelity, minimum cracking, sharpness and clearness, to those of the audio appliances having the comparative enameled windings.

The electric conductor of the present invention of the above described arrangement has the following effects.

(1) Since the electric conductor is constituted by the linear member made of copper or silver, which is composed of an assembly of segments each regarded substantially as single crystal having a length not less than twice a diameter of the single crystal, the number of the grain boundaries traversed by electric current flowing in the longitudinal direction of the electric conductor is small and portions having excessively non-uniform crystalline orientation are small in amount. Accordingly, noises and phase difference of signals are not generated in signal current of video and audio appliances. Thus, in the video appliance having the electric conductor of the present invention, white color becomes brighter and other colors become vivid, thus producing brighter pictures. Meanwhile, in the audio appliance having the electric conductor of the present invention, clear and sharp sounds are produced.

(2) Since the electric conductor of the present invention is manufactured by employing the method of producing single crystal, foreign matter, impurities and gaseous matter exerting an aggravating influence upon pictures of the video appliance and sounds of the audio appliance are eliminated from the electric conductor, thereby making the pictures and sounds clearer.

Figure 3:
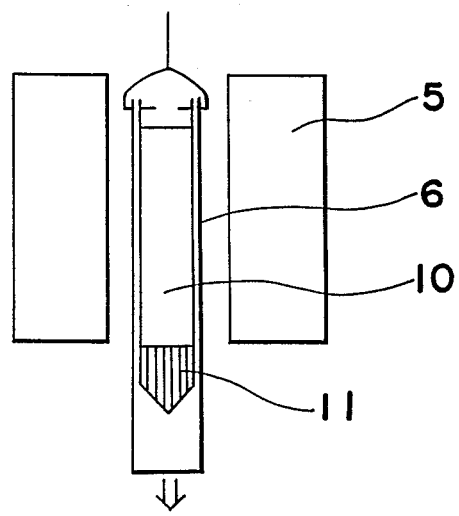
FIG. 3 and 4 are schematic cross-sectional views explanatory of methods of manufacturing the electric conductor, according to first and second embodiments of the present invention, respectively.

Hereinbelow, a method of manufacturing the electric conductor referred to above, according to the present invention will be described with reference to FIG. 3 and 4. In the method of the present invention, copper or silver is initially cured into an ingot in a single direction along a longitudinal direction of the ingot. Thus, crystal grains are arranged in parallel with each other in a longitudinal direction of the ingot and difference in orientation among the crystal grains is minimized. In order to produce the ingot, methods shown in FIGS. 3 and 4, for example, can be employed. The method of FIG. 3 is called the vertical Bridgman method. In FIG. 3, raw material 10 is loaded into the vessel 6 which is placed under vacuum or inert atmosphere in the tubular heating furnace 5. After the raw material 10 has been sequentially molten from its lower portion into molten metal while the vessel 6 is being displaced downwardly, the molten metal is cured from its bottom portion into an ingot 11 in a downward direction (a single direction) along a longitudinal direction of the ingot 11. In the ingot 11, crystal grains are arranged in parallel with each other in the longitudinal direction of the ingot 11.

Figure 4:
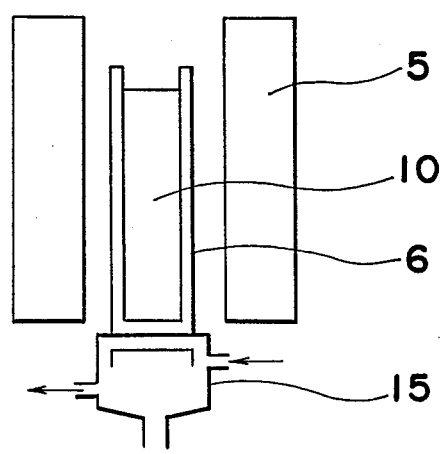

Meanwhile, in the method of FIG. 4, a water cooling mold 15 is provided at the bottom of the vessel 6 containing the raw material 10. The vessel 6 placed on the water cooling mold 15 is disposed in the tubular heating furnace 5. After the raw material 10 has been molten into molten metal, the water cooling mold 15 is water-cooled such that the molten metal is cured from a bottom portion of the vessel 6. Also in this method of FIG. 4, the molten metal is cured from its bottom portion into an ingot in a downward direction (a single direction) along a longitudinal direction of the ingot and crystal grains in the ingot are arranged in parallel with each other in the longitudinal direction of the ingot.

By employing the methods of FIG. 3 and 4, such an effect can be achieved that foreign matter, impurities and gaseous matter exerting an aggravating influence upon pictures of the video appliance and sounds of the audio appliance are displaced upwardly for their removal from the vessel 6, in addition to the above described effect that the crystal grains in the ingot are arranged in parallel with each other in the longitudinal direction of the ingot. It should be noted that methods of the present invention are not limited to those shown in FIGS. 3 and 4.

Subsequently, the ingot is drawn into a wire by cold working or warm working having a temperature range for preventing recrystallization. The cold working or the warm working is characterized by operating conditions for preventing recrystallization. By the cold working or the warm working, directional property of the crystal structure obtained by curing the molten metal in the single direction as described above is held. After the cold working or the warm working, the grain boundaries traversed by electric current flowing in the longitudinal direction of the wire are restricted to a small number and crystalline anisotropy is minimized, thereby lessening an aggravating effect of the grain boundaries upon pictures of the video appliance and sounds of the audio appliance. If recrystallization is effected during the cold working or the warm working, the above described effect achieved by curing the molten metal in the single direction is lessened.

In the method of the present invention, it can also be so arranged that a heating process having a temperature range for preventing recrystallization is performed, if necessary, during or after the cold working or the warm working. The heating process performed after the cold working or the warm working is designed to diminish defects such as point defect, dislocation, etc. extering an aggravating influence upon pictures of the video appliance and sounds of the audio appliance. If recrystallization is effected at this time, the effect achieved by curing the molten metal in the single direction is lessened. Meanwhile, the heating process performed during the cold working or the warm working is designed to prevent distortion of the crystal or an accumulated working energy from becoming excessively large or being generated in a concentrated manner.

A method according to a first embodiment of the present invention will be described with reference to FIG. 3, hereinbelow. In this method of FIG. 3 illustrating the vertical Bridgman method, copper having a purity of 99.99% is used as the raw material 10. Then, the molten metal is cured into the ingot 11 of 20 mm in diameter in the single direction along the longitudinal direction of the ingot 11. At this time, the cured structure of the ingot 11 extends in parallel with the longitudinal direction of the ingot 11. Thereafter, the ingot 11 is lightly machined on the surface and then, is washed on the surface. Subsequently, the ingot 11 is subjected to a cold wire drawing process in the course of which a heating process effecting no change of the crystal structure is performed three times at a temperature of 130°C. for 1 hr., whereby a wire of 0.1 mm in diameter is obtained. Then, 19 wires thus obtained are stranded into a stranded wire. Subsequently, the stranded wire is heated at a temperature of 130°C. for 1 hr. into an electric conductor. Thereafter, the electric conductor is subjected to insulating coating into an insulated electric wire.

In comparison with the insulated electric wire of the present invention, two insulated electric wires are similarly produced by stranding 19 known tough pitch copper wires of 0.1 mm in diameter (Comparative example 1) and 19 known oxygen-free copper wires of 0.1 mm in diameter (Comparative example 2).

Each of the three insulated electric wires of the present invention and Comparative examples 1 and 2 is used for wiring in and out of a combination appliance of a VTR and a TV set. Results of comparison of image quality and sound quality among the combination appliances are shown in Table 2 below.

TABLE 2

|  | Image Quality | Sound Quality |
| --- | --- | --- |
| Present Invention | Vivid and bright tone | Clear and sharp sound |
| Comparative example 1 | Bad brightness | Dull sound |
| Comparative example 2 | Bad brightness | Sound quality is of a rank intermediate between present invention and Comparative example 1. |

From Table 2 above, it will be understood that the combination appliance having the electric wire of the present invention is clearer, in pictures and sounds, than those of Comparative examples 1 and 2.

A method according to a second embodiment of the present invention will be described with reference to FIG. 4, hereinbelow. In the method of FIG. 4, silver having a purity of 99.995% is used as the raw material 10. Then, the molten metal is cured into the ingot of 25 mm in diameter in the single direction along the longitudinal direction of the ingot. At this time, the cured structure of the ingot extends in the longitudinal direction of the ingot. Subsequently, the ingot is subjected to warm wire drawing under a temperature condition effecting no recrystallization and thus, a wire of 10 mm in diameter is obtained. Thereafter, the wire is subjected to cold wire drawing into a fine wire of 0.05 to 0.3 mm in diameter. This fine wire is coated with enamel into an enameled winding or 7 to 19 fine wires thus obtained are stranded and insulated into an insulated electric wire. The enameled winding and the insulated electric wire are used for wiring of a voice coil, a pickup cord, etc. in an audio appliance and between components of the audio appliance.

In comparison with the enameled winding and the insulated electric wire of the present invention, an enameled winding and an insulated electric wire are produced by using known tough pitch copper wires. These enameled winding and insulated electric wire formed by known tough pitch copper wires are likewise used for wiring of the audio appliance.

As a result of comparison between the audio appliance having the electric wires of the present invention and the audio appliance having the known tough pitch copper wires, it was found that sounds of the audio appliance having the electric wires of the present invention are of more excellent quality having high clearness, sharpness and fidelity without being cracked or distorted in a wide compass from a high pitch to a low pitch than those of the audio appliance having the known tough pitch copper wires.

The method of manufacturing the electric conductor for video and audio appliances, according to the present invention has the following effects.

(1) Since molten copper or molten silver is cured into the ingot in the single direction along the longitudinal direction of the ingot, the crystal grains are arranged in parallel with each other in the longitudinal direction of the ingot and thus, crystalline anisotropy is not produced. Since the ingot is subsequently subjected to cold working or warm working, recrystallization does not take place during the cold working or the warm working. Since the crystal grains are arranged in parallel with each other in the longitudinal direction of the electric conductor, crystalline anisotropy of the electric conductor is minimized, so that noises or phase difference is not produced in audio and video signals of signal current flowing through the electric conductor. Accordingly, in the video appliance having the electric conductor of the present invention, white color becomes brighter and other colors become vivid, thus producing brighter pictures. Meanwhile, in the audio appliance having the electric conductor of the present invention, clear and sharp sounds are produced.

(2) Since foreign matter and impurities exerting an aggravating influence upon pictures of the video appliance and sounds of the audio appliance are eliminated from the electric conductor by curing molten copper or molten silver in the single direction along the longitudinal direction of the electric conductor, thereby making the pictures and sounds clearer.

(3) Since crystalline anisotropy of the electric conductor is minimized, electric current flowing in the longitudinal direction of the electric conductor is least adversely affected by the grain boundaries extending in parallel with each other in the longitudinal direction of the electric conductor and thus, clearer pictures and sounds are produced by the video and audio appliances having the electric conductors of the present invention, respectively.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. An electric wire for connecting audio appliances, comprising an elongated member composed of one single crystal of copper of not less than 99.99% in purity such that the single crystal extends throughout the elongated member in a longitudinal direction of the elongated member.

2. An electric wire for connecting audio appliances, comprising an elongated member composed of a plurality of crystals of copper of not less than 99.99% in purity such that the crystals extend throughout the elongated member in a longitudinal direction of the elongated member in parallel with each other.

3. An electric conductor comprising an electric wire for connecting audio appliances, which is obtained by subjecting a first electric wire to a wire drawing process, the first electric wire comprising an elongated member composed of one single crystal of copper of not less than 99.99% in purity such that the single crystal extends throughout the elongated member in a longitudinal direction of the elongated member.

4. An electric conductor comprising an electric wire for connecting audio appliances, which is obtained by subjecting a second wire to a wire drawing process, the second wire comprising an elongated member composed of a plurality of crystals of copper of not less than 99.99% in purity such that the crystals extend throughout the elongated member in a longitudinal direction of the stringlike member in parallel with each other.

5. A stranded electric conductor, which is obtained by stranding plurality of the electric wires as defined in claim 3.

6. A stranded electric conductor, which is obtained by stranding a plurality of the electric wires as defined in claim 4.

* * * * *